US011469124B2

(12) United States Patent
Patil Shanthaveeraswamy et al.

(10) Patent No.: US 11,469,124 B2
(45) Date of Patent: Oct. 11, 2022

(54) CONTACTLESS LATCH AND COUPLING FOR VACUUM WAFER TRANSFER CASSETTE

(71) Applicant: Applied Materials, Inc., Santa Clara, CA (US)

(72) Inventors: Shreyas Patil Shanthaveeraswamy, Bangalore (IN); Ribhu Gautam, Bengaluru (IN); Kumaresan Nagarajan, Bengaluru (IN); Vijay Singh, Bangalore (IN); Andrew J. Constant, Cupertino, CA (US); Michael P. Karazim, San Jose, CA (US); Kim Ramkumar Vellore, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 16/752,502

(22) Filed: Jan. 24, 2020

(65) Prior Publication Data
US 2020/0286760 A1 Sep. 10, 2020

Related U.S. Application Data

(60) Provisional application No. 62/813,790, filed on Mar. 5, 2019.

(51) Int. Cl.
*H01L 21/673* (2006.01)
*H01L 21/67* (2006.01)

(52) U.S. Cl.
CPC .. *H01L 21/67379* (2013.01); *H01L 21/67167* (2013.01); *H01L 21/67201* (2013.01)

(58) Field of Classification Search
CPC ......... H01L 21/67379; H01L 21/67167; H01L 21/67201; H01L 21/67353;
(Continued)

(56) References Cited

U.S. PATENT DOCUMENTS

| 3,744,833 A | 7/1973 | Berducone |
| 6,428,262 B1 | 8/2002 | Vanderpot et al. |

(Continued)

FOREIGN PATENT DOCUMENTS

JP 2011-258722 A 12/2011

OTHER PUBLICATIONS

International Search Report/ Written Opinion issued to PCT/US2020/015085 dated May 22, 2020.

*Primary Examiner* — Glenn F Myers
(74) *Attorney, Agent, or Firm* — Patterson + Sheridan, LLP

(57) ABSTRACT

Embodiments of the present disclosure relate to a substrate transfer device having a contactless latch and contactless coupling providing the ability to lock and unlock the substrate transfer device at atmospheric and vacuum pressure with without particle generation at a base of the substrate transfer device, the contactless latch, and the contactless coupling. The substrate transfer device includes a lid having one or more lid grooves, a base having one or more base grooves, and a rotation member rotatably coupled to the lid. Each flange of one or more flanges of the substrate transfer device is rotatable in aligned lid grooves and base grooves, and each flange of the one or more flanges has an arm with a ferromagnetic material coupled thereto. The base is coupled to the lid when the ferromagnetic material of the arm is aligned and spaced from a magnetic material of a slot of the one or more base grooves.

20 Claims, 4 Drawing Sheets

(58) Field of Classification Search
CPC ......... H01L 21/67373; H01L 21/67376; H01L 21/67386
See application file for complete search history.

(56) References Cited

U.S. PATENT DOCUMENTS

| | | |
|---|---|---|
| 6,935,828 B2 | 8/2005 | Ackeret et al. |
| 2002/0074635 A1 | 6/2002 | Hattori et al. |
| 2007/0175792 A1 | 8/2007 | Gregerson |
| 2009/0196714 A1 | 8/2009 | Sylvestre et al. |
| 2012/0037522 A1* | 2/2012 | Chiu ................. H01L 21/67359 206/316.1 |
| 2013/0089396 A1 | 4/2013 | Bufano et al. |
| 2013/0153462 A1* | 6/2013 | Hara .................... H01L 21/673 206/711 |

* cited by examiner

CONTACTLESS LATCH AND COUPLING FOR VACUUM WAFER TRANSFER CASSETTE

CROSS-REFERENCE TO RELATED APPLICATIONS

This application claims priority to U.S. Provisional Patent Application Ser. No. 62/813,790, filed on Mar. 5, 2019, which herein is incorporated by reference.

BACKGROUND

Field

Embodiments of the present disclosure generally relate to substrate transfer devices. More particularly, embodiments of the present disclosure relate to a substrate transfer device having a contactless latch and contactless coupling.

Description of the Related Art

Substrate throughput in semiconductor processing is always a challenge. If technology is to advance, semiconductor substrates continually need to be processed efficiently. Cluster tools have developed as an effective means for processing multiple substrates simultaneously without breaking vacuum. Instead of processing a single substrate and then exposing the substrate to atmosphere during transfer to another chamber, multiple process chambers can be connected to a common transfer chamber so that when a process is complete on the substrate in one process chamber, the substrate can be moved, while still under vacuum, to another process chamber.

Additionally, substrate access chambers may be used to connect a factory environment, which is at atmospheric pressure, to a load lock chamber coupled to the transfer chamber, which is under vacuum. A substrate transfer device may be utilized to transfer substrates from the factory environment to a substrate access chamber of a cluster tool and to transfer substrates between cluster tools of the factory environment at atmospheric pressure. However, latch mechanisms of the substrate transfer device and coupling mechanisms between the substrate transfer device and the substrate access chambers may lead to particle generation in the substrate transfer devices and the substrate access chambers.

Therefore, there is a need for an improved substrate transfer device.

SUMMARY

In one embodiment, a substrate transfer device is provided. The substrate transfer device includes a lid having one or more lid grooves, a base having one or more base grooves, and a rotation member rotatably coupled to the lid. Each of the one or more base grooves is alignable with one of the one or more lid grooves. Each of the one or more base grooves has a slot with a magnetic material coupled thereto. The rotation member has one or more flanges extending therefrom, each flange of the one or more flanges is rotatable in aligned lid grooves and base grooves. Each flange of the one or more flanges has an arm with a ferromagnetic material coupled thereto. The base is coupled to the lid when the ferromagnetic material of the arm is aligned and spaced from the magnetic material of the slot.

In another embodiment, a substrate transfer device is provided. The substrate transfer device includes a lid having one or more lid grooves, a base having one or more base grooves, and a rotation member rotatably coupled to the lid. Each of the one or more base grooves is alignable with one of the one or more lid grooves. Each of the one or more base grooves has a slot with a magnetic material coupled thereto. The rotation member has one or more flanges extending therefrom. Each flange of the one or more flanges is rotatable in aligned lid grooves and base grooves. Each flange of the one or more flanges has an arm with a ferromagnetic material coupled thereto. The base is coupled to the lid when the ferromagnetic material of the arm is aligned and spaced from the magnetic material of the slot. A crossbar with a bracket is coupled to a midpoint of the crossbar. The bracket has an output side comprising two or more first holes having first magnets disposed therein with alternating polarities.

In yet another embodiment, a substrate transfer device is provided. The substrate transfer device includes a lid having one or more lid grooves, a base having one or more base grooves, and a rotation member rotatably coupled to the lid by a bearing assembly. Rach of the one or more base grooves is alignable with one of the one or more lid grooves. Each of the one or more base grooves has a slot with a magnetic material coupled thereto. The rotation member has one or more flanges extending therefrom. Each flange of the one or more flanges is rotatable in aligned lid grooves and base grooves. Each flange of the one or more flanges has an arm with a ferromagnetic material coupled thereto. The base is coupled to the lid when the ferromagnetic material of the arm is aligned and spaced from the magnetic material of the slot. A crossbar with a bracket is coupled to a midpoint of the crossbar. The bracket has an output side comprising two or more first holes having first magnets disposed therein with alternating polarities. The bearing assembly has a bearing ring coupled to the lid and a capture ring coupling the rotation member to the bearing ring. The inner diameter of the rotation member is disposed around an outer diameter of the bearing ring. A mounting plate is coupled to the rotation member. The mounting plate has a catcher with a channel for retaining a lift plate of a stem of a substrate access chamber. The mounting plate and catcher have openings for a rotation shaft to be disposed through the stem and the openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a substrate transfer device having a contactless latch and contactless coupling. The substrate transfer device includes a lid having one or more lid grooves and a base having one or more base grooves. Each of the one or more base grooves are alignable with one of the one or more lid grooves, and each of the one or more base grooves have a slot with a magnetic material coupled thereto. A rotation member is rotatably coupled to the lid. The rotation member has one or more flanges extending therefrom. Each flange of the one or more flanges is rotatable in aligned lid grooves and base grooves, and each flange of the one or more flanges has an arm with a ferromagnetic material coupled thereto. The base is coupled to the lid when the ferromagnetic material of the arm is aligned and spaced from the magnetic material of the slot.

Figure 1:
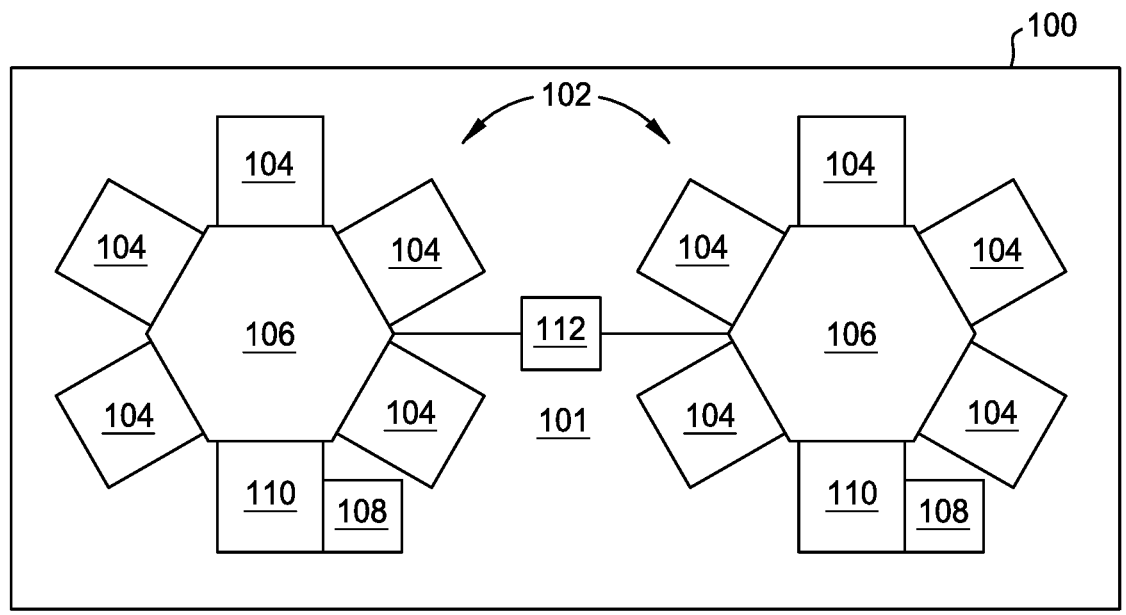
FIG. 1 is a schematic view of a factory floor according to an embodiment.

FIG. 1 is a schematic view of a factory floor 100. The factory floor 100 corresponding to a factory environment 101 includes two or more systems 102. Each of the two or more systems 102 includes a transfer chamber 106 surrounded by one or more processing chambers 104. Additionally, each of the two or more systems 102 include a substrate access chamber 108 coupled to a load lock chamber 110. The substrate access chamber 108 may be utilized to connect the factory environment 101, which is at atmospheric pressure, to the load lock chamber 110, which is under vacuum pressure. In some embodiments, which can be combined with other embodiments described herein, the transfer chamber 106 is provided with a vacuum transfer robot located therein for transferring substrates between the load lock chamber 110 and the processing chambers 104, which are located about the periphery of the transfer chamber 106. A controller 112 is coupled to the two or more systems 102 and configured to control aspects of the two or more systems 102 during processing.

Figure 2:
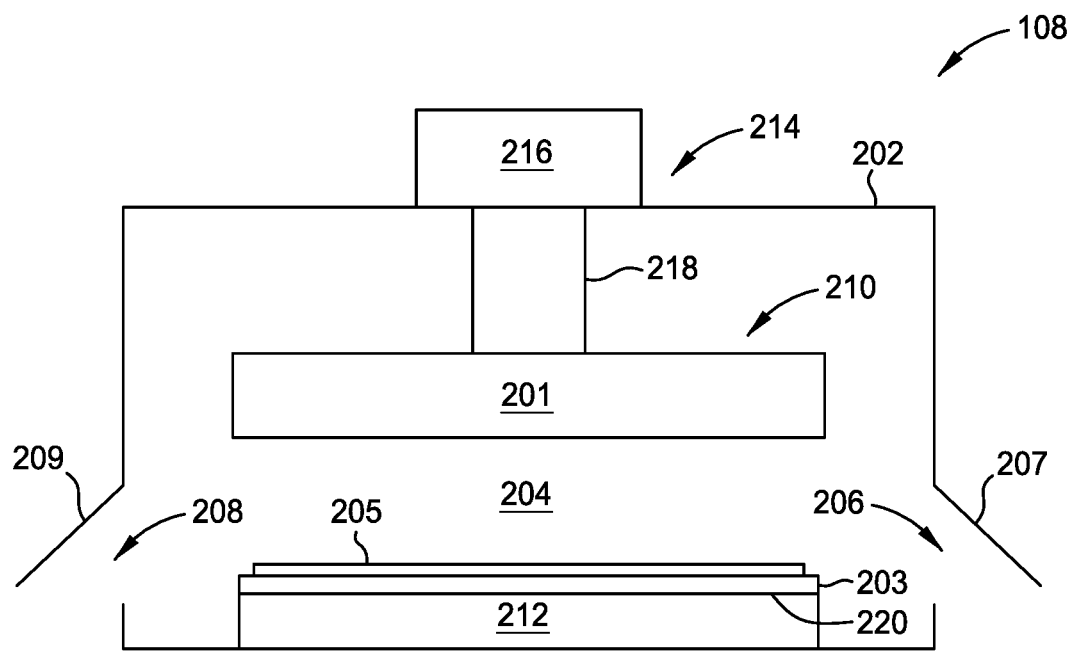
FIG. 2 is a schematic cross-sectional view of the substrate access chamber according to an embodiment.

FIG. 2 is a schematic cross-sectional view of the substrate access chamber 108. It is to be understood that the system is an exemplary system and other systems, including systems from other manufacturers, may be used with or modified to accomplish aspects of the present disclosure. The substrate access chamber 108 includes a chamber body 202 defining a chamber volume 204. The chamber volume 204 is accessible via a first substrate access port 206 of the chamber body 202 through which a substrate transfer device 210 passes when moving between the substrate access chamber 108 and the factory environment 101. The chamber volume 204 is additionally accessible via a second substrate access port 208 through which substrates pass when moving between the substrate access chamber 108 and the load lock chamber 110. The first substrate access port 206 and the second substrate access port 208 are selectively sealed by respective slit valve doors 207, 209 adapted to selectively isolate the chamber volume 204 from the environment of the load lock chamber 110 and the factory environment 101.

The substrate access chamber 108 includes a pedestal 212 and a lift assembly 214. The lift assembly 214 includes a lift and rotation system 216 (e.g., one or more actuators) coupled to a stem 218. The lift and rotation system 216 moves the stem 218 to between an elevated processing position (as shown) and a lowered position (not shown) that facilitates coupling of the stem 218 to the substrate transfer device 210. The lift and rotation system 216 rotates a rotation shaft 301 (shown in FIGS. 3A and 3B) disposed in the stem 218 such that a lid 201 of the substrate transfer device 210 actuates relative to a base 203 of the substrate transfer device 210. The pedestal 212 includes a support surface 220 for supporting the base 203 of the substrate transfer device 210.

Figure 3A:
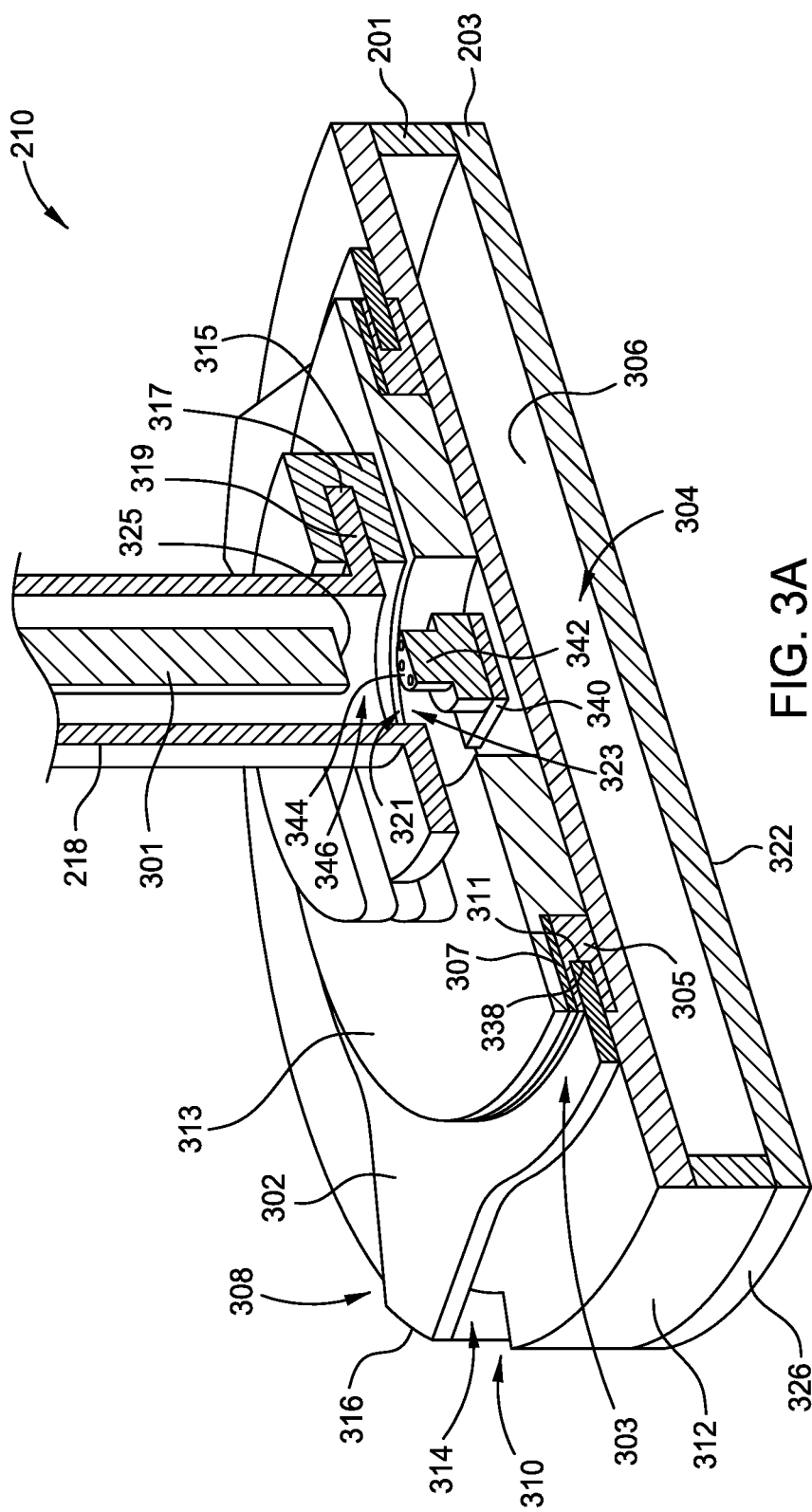
FIG. 3A is a schematic cross-sectional view of a substrate transfer device according to an embodiment.
Figure 3B:
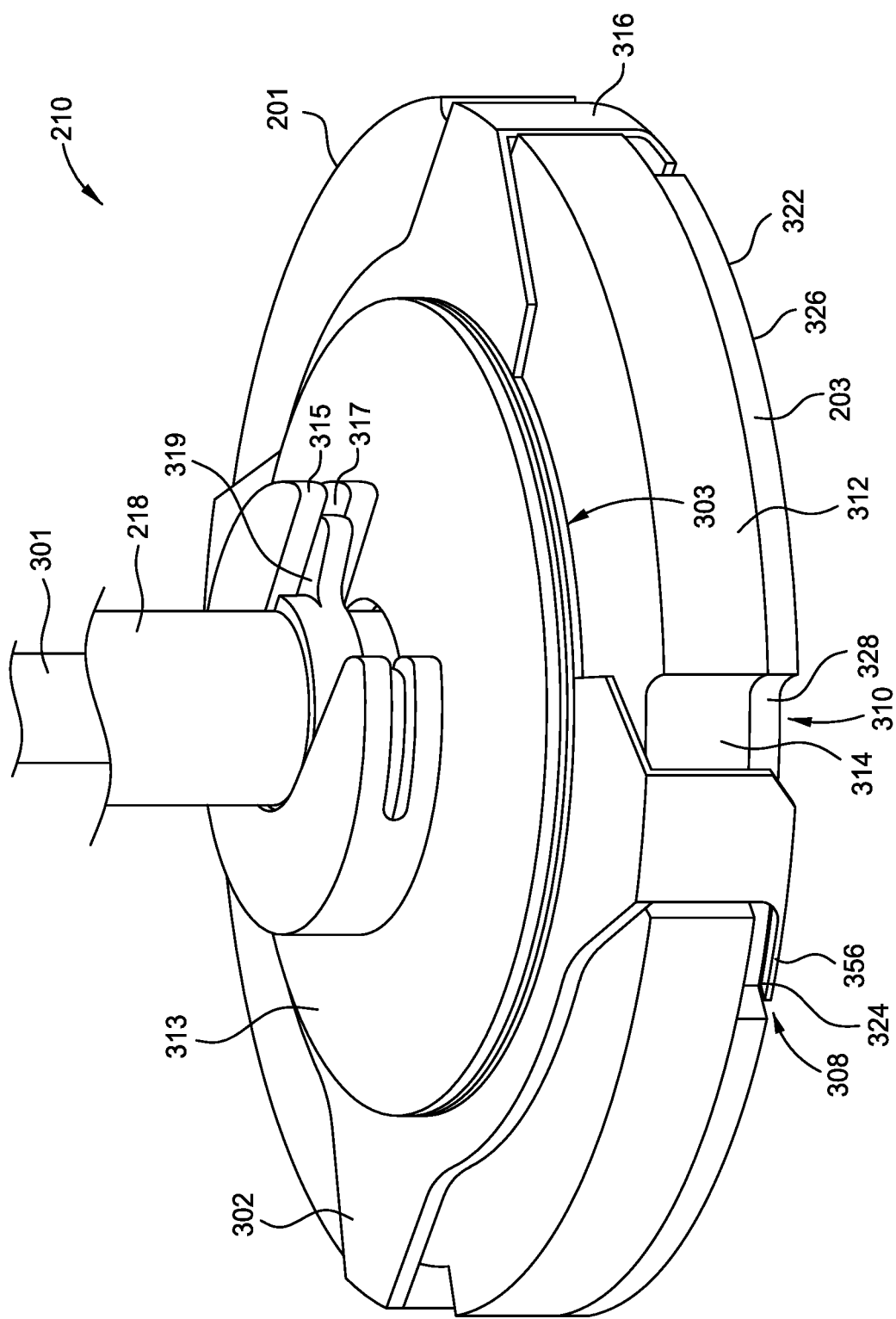
FIG. 3B is a schematic planar view of a substrate transfer device according to an embodiment.

FIG. 3A is a schematic cross-sectional view and FIG. 3B is a schematic planar view of the substrate transfer device 210. The substrate transfer device 210 includes the lid 201, the base, 203, and a rotation member 302 rotatably coupled to the lid 201. The lid 201 and the base 203 coupled thereto define a cavity 304 for holding one or more substrates. In one embodiment, which can be combined with other embodiments described herein, the cavity 304 holds only one substrate. The base 203 includes a support surface 306 for supporting the one or more substrates. In one embodiment, which can be combined with other embodiments described herein, the base 203 supports only one substrate. As shown in FIG. 3A and FIG. 3B, the rotation member 302 of the substrate transfer device 210, which is rotatably coupled to the lid 201, is in a coupling position 308 (shown in FIG. 3C) such that the lid 201 is coupled to the base 203. The rotation member 302 may be rotated to the coupling position 308 and rotated from the coupling position 308 to a decoupling position 310 (shown in FIG. 3C) via the rotation shaft 301 of the lift assembly 214 or via another manner operable to generate a torque greater than about 1 Nm. The lid 201 includes an outer diameter 312 with one or more lid grooves 314 formed therein. The rotation member 302 includes one or more flanges 316 disposed in the one or more lid grooves 314.

Figure 3C:
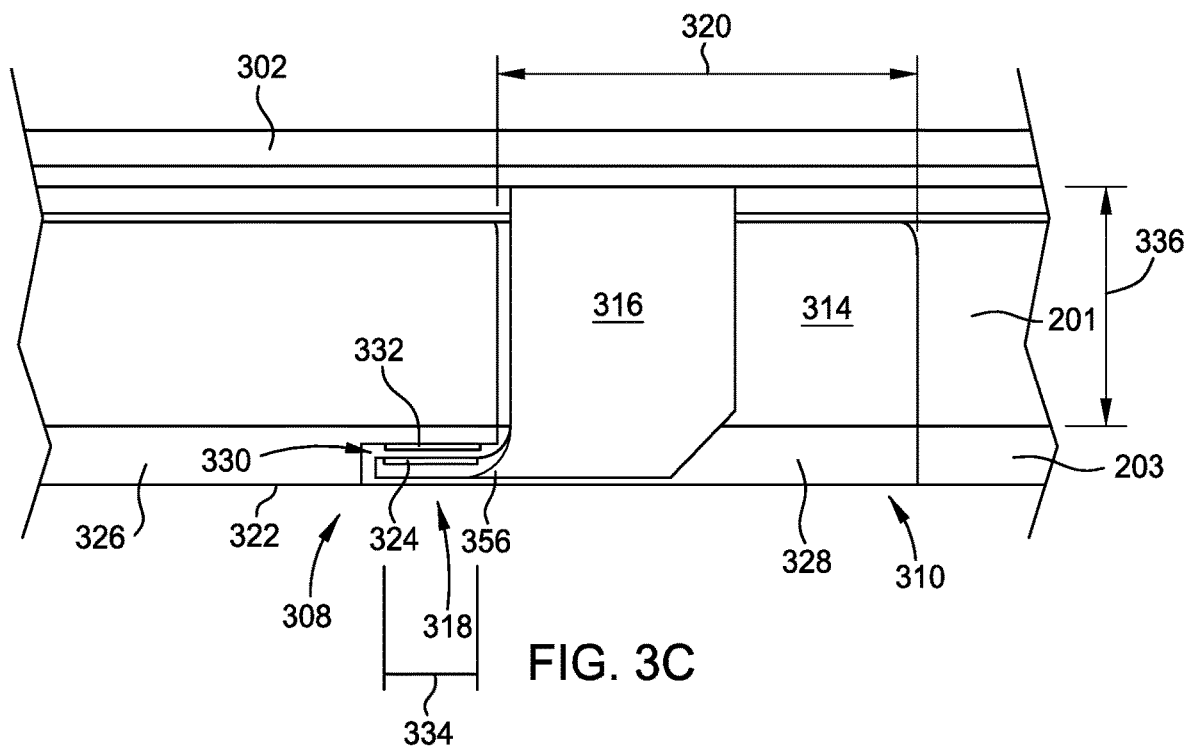
FIG. 3C is a schematic view of a contactless latch of a substrate transfer device according to an embodiment.

As shown in FIG. 3C, a schematic side view of a contactless latch 318, each of one or more lid grooves 314 has a width 320 such that each flange 316 of the of the rotation member 302 may rotate from the coupling position 308 to the decoupling position 310. Each of the one or more flanges 316 has an arm 356 with a ferromagnetic material 324 coupled thereto. The base 203 includes an outer diameter 326 with one or more base grooves 328 formed therein. Each of the one or more base grooves 328 includes a slot 330 formed in a bottom surface 322 of the base 203. Each of the one or more slots 330 formed in the bottom surface 322 of the base 203 includes a magnetic material 332. The one or more base grooves 328 are alignable with the one or more lid grooves 314. Each slot 330 has a width 334 and each flange 316 has a length 336 such that the ferromagnetic material 324 of the arm 356 is aligned and spaced from the magnetic material 332 of the slot 330. The magnetic material 332 and the ferromagnetic material 324 are spaced at a distance of about 0.7 mm to about 1.1 mm, such as about 1 mm. In some embodiments, which can be combined with other embodiments described herein, the magnetic material 332 includes a neodymium grade n52 magnet. In some embodiments, which can be combined with other embodiments described herein, the ferromagnetic material 324 includes nickel. The distance between the magnetic material 332 and the ferromagnetic material 324 results in a pull force of about 1.5 N to about 1.7 N and a magnetic field strength of about 1650 gauss to about 1850 gauss. The distance between the magnetic material 332 and the ferromagnetic material 324 of about 1 mm results in the pull force of about 1.55 N and the magnetic field strength of about 1764 gauss. The pull force between the magnetic material 332 and ferromagnetic material 324 with the rotation member 302 in the coupling position 308 retains the base 203 to the lid 201. A torque greater than about 1 Nm is required to overcome the pull force to rotate the rotation member to the decoupling position 310. The contactless latch 118 allows the rotation member 302 to be rotated to the coupling position 308 and rotated from the coupling position 308 to a decoupling position 310 without particle generation at the contactless latch 118 and the base 203.

In some embodiments, which can be combined with other embodiments described herein, the rotation member 302 is rotatably coupled to the lid 201 via a bearing assembly 303. The bearing assembly 303 includes a bearing ring 305 and a capture ring 307. The bearing ring 305 is coupled to the lid 201. An inner diameter 338 of the rotation member 302 is disposed around an outer diameter 311 of the bearing ring 305. The rotation member 302 is coupled to the bearing ring 305 via the capture ring 307. In some embodiments, which can be combined with other embodiments described herein, a mounting plate 313 having a catcher 315 is coupled to the rotation member 302 rotatably coupled to the lid 201. In some embodiments, which can be combined with other embodiments described herein, the mounting plate 313 having the catcher 315 is coupled to the capture ring 307. The catcher 315 includes a channel 317 for retaining a lift plate 319 of the stem 218. The catcher 315, lift plate 319, have openings 321, 323 for the rotation shaft 301 to be disposed therethrough. The rotation member 302 includes a crossbar 340 and a bracket 342 coupled to a midpoint of the crossbar 340. When the lift plate 319 is retained in the channel 317, a drive side 325 of the rotation shaft 301 facing an output side 344 of the bracket 342 results in a contactless coupling 346 of the rotation shaft 301 and the bracket 342.

Figure 3D:
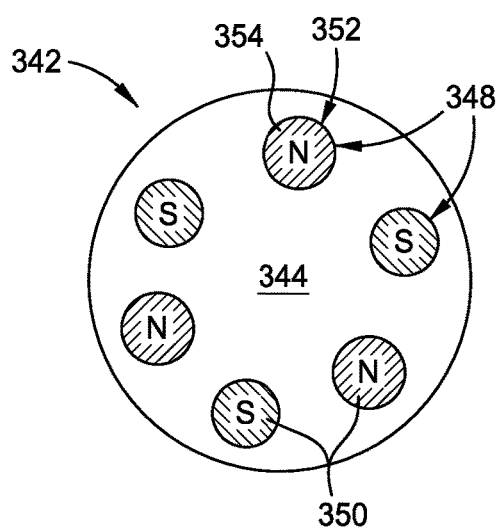
FIG. 3D is a schematic top view of an output side of a bracket according to an embodiment.
Figure 3E:
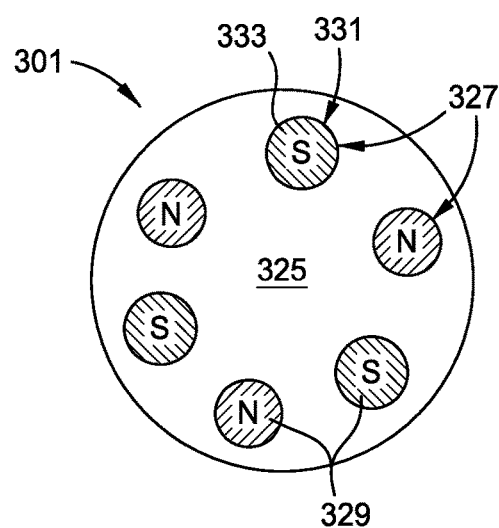
FIG. 3E is a schematic top view of a drive side of a rotation shaft according to an embodiment.

As shown in FIG. 3D, a schematic top view of the output side 344 of the bracket 342, the output side 344 of the bracket 342 includes two or more first holes 348 having first magnets 350 disposed therein with alternating polarities. As shown in FIG. 3E, a schematic top view of the drive side 325 of the rotation shaft 301, the drive side 325 of the rotation shaft 301 includes two or more second holes 327 having second magnets 329 disposed therein with alternating polarities. The number of first holes 348 and second holes 327 is the same. The two or more of the first holes 348 align with respective holes of the two or more second holes 327. An initial first magnet 354 of the first magnets 350 in an initial first hole 352 of the two or more of the first holes 348 has a different polarity than an first second magnet 333 of second magnets 329 in an initial second hole 331 of the two or more of the second holes 327 such that the rotation shaft 301 and the bracket 342 form the contactless coupling 346. The drive side 325 of the rotation shaft 301 and the output side 344 of the bracket 342 are spaced at a distance of about 0.7 mm to about 1.1 mm, such as 1 mm. The distance between the drive side 325 of the rotation shaft 301 and the output side 344 of the bracket 342 results in a pull force of about 1.4 N to about 1.6 N and a magnetic field strength of about 9000 gauss to about 10000 gauss. The distance between the drive side 325 of the rotation shaft 301 and the output side 344 of the bracket 342 of about 1 mm results in the pull force of about 1.47 N and the magnetic field strength of about 9662 gauss. The pull force between the rotation shaft 301 and the bracket 342 when the lift plate 319 is retained in the channel 317 allows the lift and rotation system 216 of the substrate access chamber 108 to rotate the rotation member 302 to the decoupling position 310 with a torque greater than about 1 Nm to overcome the pull force of the contactless latch 318. The contactless coupling 346 allows the rotation member 302 to be rotated to the coupling position 308 and rotated from the coupling position 308 to a decoupling position 310 without particle generation at the contactless coupling 346 and the base 203.

In summation, a substrate transfer device having a contactless latch and contactless coupling is described herein. Each of the one or more flanges of the rotation member rotatably coupled to the lid of the substrate transfer device having having an arm with a ferromagnetic material coupled thereto provides for contactless latching of the base of the substrate transfer device when the ferromagnetic material is aligned and spaced from the magnetic material of the slot formed in the base. The rotation member having a crossbar with a bracket coupled to a midpoint of the crossbar with an output side of the bracket comprising two or more first holes having first magnets disposed therein with alternating polarities provide for contactless coupling to a drive side of a rotation shaft of a substrate access chamber that has two or more second holes having second magnets disposed therein with alternating polarities. The contactless latch and a contactless coupling provide the ability to lock and unlock the substrate transfer device at atmospheric and vacuum pressure with without particle generation at the base, the contactless latch, and the contactless coupling.

While the foregoing is directed to examples of the present disclosure, other and further examples of the disclosure may be devised without departing from the basic scope thereof, and the scope thereof is determined by the claims that follow.

What is claimed is:

1. A substrate transfer device, comprising:
a lid having one or more lid grooves;
a base having one or more base grooves, each of the one or more base grooves alignable with one of the one or more lid grooves, each of the one or more base grooves having a slot with a magnetic material coupled thereto; and
a rotation member rotatably coupled to the lid, the rotation member having:
one or more flanges extending therefrom, each flange of the one or more flanges is rotatable in aligned lid grooves and base grooves, each flange of the one or more flanges having an arm with a ferromagnetic material coupled thereto, wherein the base is coupled to the lid when the ferromagnetic material of the arm is aligned and spaced from the magnetic material of the slot.

2. The device of claim 1, wherein the rotation member comprises a crossbar with a bracket coupled to a midpoint of the crossbar, the bracket having an output side comprising two or more first holes having first magnets disposed therein with alternating polarities.

3. The device of claim 2, further comprising a mounting plate coupled to the rotation member, the mounting plate having a catcher with a channel for retaining a lift plate of a stem of a substrate access chamber.

4. The device of claim 3, wherein the mounting plate and catcher have openings for a rotation shaft to be disposed through the stem and the openings.

5. The device of claim 4, wherein an drive side of the rotation shaft has two or more second holes having second magnets disposed therein with alternating polarities.

6. The device of claim 5, wherein an initial first magnet of the first magnets in an initial first hole of the two or more of the first holes has a different polarity than an initial second magnet of the second magnets in an initial second hole of the two or more of the second holes.

7. The device of claim 6, wherein a pull force between the rotation shaft and the bracket is about 1.4 N to about 1.6 N.

8. The device of claim 7, wherein a distance between the drive side of the rotation shaft and the output side of the bracket is about 0.7 mm to about 1.1 mm.

9. The device of claim 1, wherein a pull force between the ferromagnetic material and the magnetic material is about 1.5 N to about 1.7 N.

10. The device of claim 9, wherein a distance between the ferromagnetic material and the magnetic material is about 0.7 mm to about 1.1 mm.

11. The device of claim 10, wherein the ferromagnetic material comprises nickel.

12. A substrate transfer device, comprising:
a lid having one or more lid grooves;
a base having one or more base grooves, each of the one or more base grooves alignable with one of the one or more lid grooves, each of the one or more base grooves having a slot with a magnetic material coupled thereto; and
a rotation member rotatably coupled to the lid, the rotation member having:
one or more flanges extending therefrom, each flange of the one or more flanges is rotatable in aligned lid grooves and base grooves, each flange of the one or more flanges having an arm with a ferromagnetic material coupled thereto, wherein the base is coupled to the lid when the ferromagnetic material of the arm is aligned and spaced from the magnetic material of the slot; and
a crossbar with a bracket coupled to a midpoint of the crossbar, the bracket having an output side comprising two or more first holes having first magnets disposed therein with alternating polarities.

13. The device of claim 12, wherein the rotation member is operable to be rotated between a coupling position to a decoupling position, and wherein:
the coupling position corresponds to when the ferromagnetic material of the arm is aligned and spaced from the magnetic material of the slot; and
the decoupling position corresponds to when a torque overcomes a first pull force between the ferromagnetic material and the magnetic material.

14. The device of claim 13, wherein the first pull force between the ferromagnetic material and the magnetic material forms a contactless latch and is about 1.5 N to about 1.7 N, and the torque greater than about 1 Nm is required to overcome the first pull force to rotate the rotation member to the decoupling position.

15. The device of claim 14, further comprising a mounting plate coupled to the rotation member, the mounting plate having a catcher with a channel for retaining a lift plate of a stem of a substrate access chamber, and the mounting plate and catcher having openings for a rotation shaft to be disposed through the stem and the openings.

16. The device of claim 15, wherein an drive side of the rotation shaft has two or more second holes having second magnets disposed therein with alternating polarities.

17. The device of claim 16, wherein an initial first magnet of the first magnets in an initial first hole of the two or more of the first holes has a different polarity than an initial second magnet of the second magnets in an initial second hole of the two or more of the second holes.

18. The device of claim 17, wherein a second pull force between the rotation shaft and the bracket is about 1.4 N to about 1.6 N.

19. The device of claim 18, wherein rotating the rotation shaft having a contactless coupling with the bracket overcomes the first pull force between the ferromagnetic material and the magnetic material without particle generation at the contactless coupling, contactless latch, and the base.

20. A substrate transfer device, comprising:
a lid having one or more lid grooves;
a base having one or more base grooves, each of the one or more base grooves alignable with one of the one or more lid grooves, each of the one or more base grooves having a slot with a magnetic material coupled thereto;
a rotation member rotatably coupled to the lid by a bearing assembly, the rotation member having:
one or more flanges extending therefrom, each flange of the one or more flanges is rotatable in aligned lid grooves and base grooves, each flange of the one or more flanges having an arm with a ferromagnetic material coupled thereto, wherein the base is coupled to the lid when the ferromagnetic material of the arm is aligned and spaced from the magnetic material of the slot; and
a crossbar with a bracket coupled to a midpoint of the crossbar, the bracket having an output side comprising two or more first holes having first magnets disposed therein with alternating polarities; and
the bearing assembly having:
a bearing ring coupled to the lid, wherein an inner diameter of the rotation member is disposed around an outer diameter of the bearing ring; and
a capture ring coupling the rotation member to the bearing ring; and
a mounting plate coupled to the rotation member, the mounting plate having a catcher with a channel for retaining a lift plate of a stem of a substrate access chamber, the mounting plate and catcher having openings for a rotation shaft to be disposed through the stem and the openings.

* * * * *